United States Patent
Hsu

Patent Number: 6,114,197
Date of Patent: Sep. 5, 2000

[54] METHOD OF FORMING FULLY DEPLETED SIMOX CMOS HAVING ELECTROSTATIC DISCHARGE PROTECTION

[75] Inventor: Sheng Teng Hsu, Camas, Wash.

[73] Assignees: Sharp Laboratories of America, Inc., Camas, Wash.; Sharp Kabushiki Kaisha, Osaka, Japan

[21] Appl. No.: 09/031,143

[22] Filed: Feb. 26, 1998

[51] Int. Cl.⁷ .................... H01L 21/8238; H01L 21/26
[52] U.S. Cl. .................... 438/199; 438/218; 438/412; 438/423
[58] Field of Search .................... 438/154, 155, 438/151, 161, 162, 199, 218, 412, 423, 443, 405, 526

[56] References Cited

U.S. PATENT DOCUMENTS

| | | | |
|---|---|---|---|
| 5,399,507 | 3/1995 | Sun | 437/24 |
| 5,773,326 | 6/1998 | Gilbert et al. | 438/154 |
| 5,877,048 | 3/1999 | Wu | 438/199 |
| 5,894,152 | 4/1999 | Jaso et al. | 257/347 |
| 5,923,067 | 7/1999 | Voldman | 257/349 |
| 5,952,695 | 9/1999 | Ellis-Monaghan et al. | 257/347 |

FOREIGN PATENT DOCUMENTS

| | | |
|---|---|---|
| 0530972 A2 | 3/1993 | European Pat. Off. . |
| 0795971 | 9/1997 | European Pat. Off. . |
| 04069966 | 3/1992 | Japan . |

OTHER PUBLICATIONS

Article entitled, ESD Reliability and Protection Schemes in SOI CMOS Output Buffers by M. Chan, S. Yuen, Z–J Ma, K. Y. Hui, P. K. Ko and C. Hu pulished in the IEEE Transactions on Electron Devices, vol. 42, No. 10, Oct. 1995, pp. 1816–1821.

*Primary Examiner*—Andrew Tran
*Assistant Examiner*—Michael S. Lebentritt
*Attorney, Agent, or Firm*—David C. Ripma; Matthew Rabdau

[57] ABSTRACT

The formation of a fully-depleted, ESD protected CMOS device is described. The device is formed on an SOI or SIMOX substrate, over which an oxide pad is grown to a thickness of between 10 and 30 nm. Appropriate ions are implanted into the oxide to adjust the threshold voltage of an ESD transistor. A portion of the top silicon film is thinned to a thickness no greater than 50 nm. The fully depleted CMOS devices are fabricated onto the thinned top silicon film, while the ESD devices are fabricated onto the top silicon film having the original thickness.

13 Claims, 3 Drawing Sheets

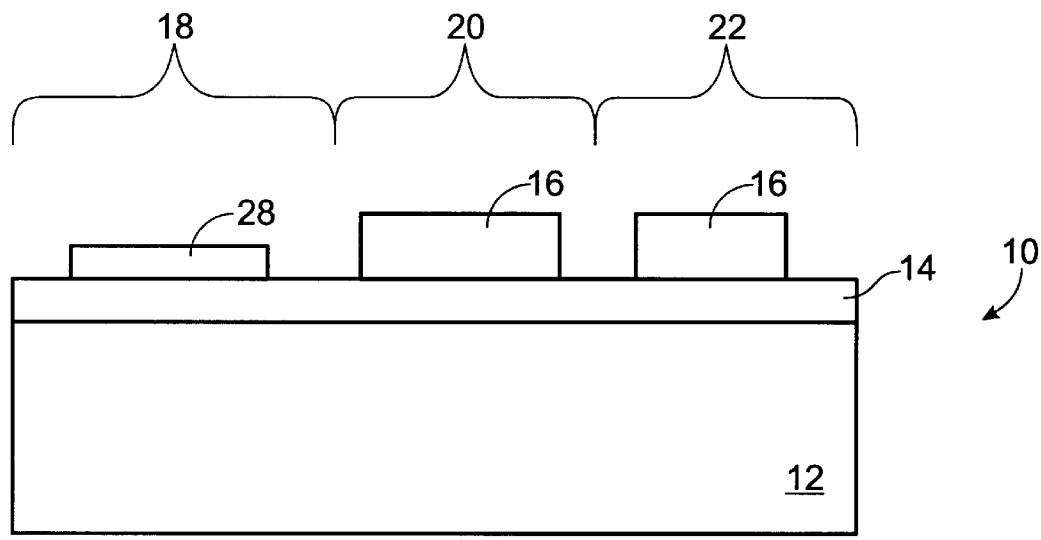
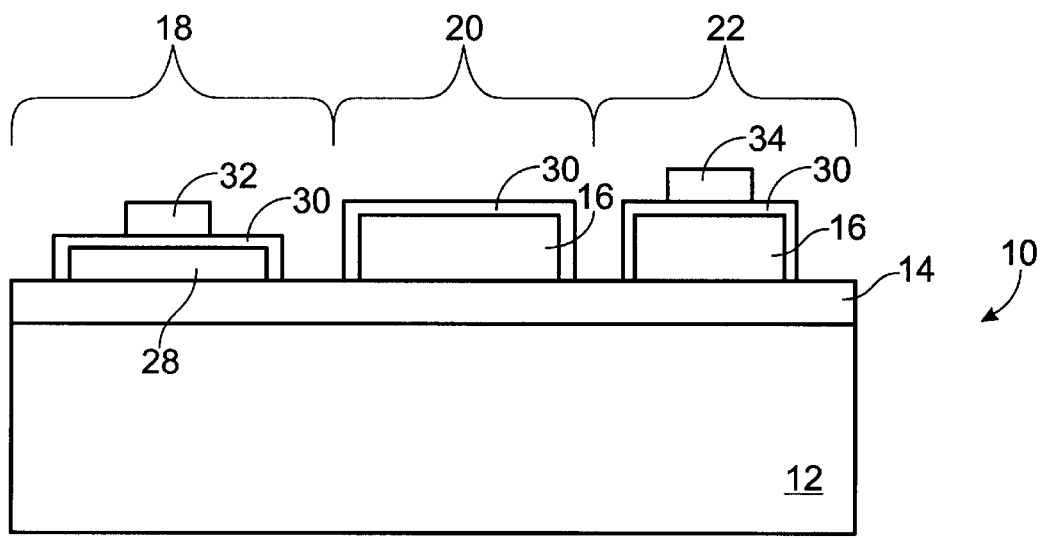

METHOD OF FORMING FULLY DEPLETED SIMOX CMOS HAVING ELECTROSTATIC DISCHARGE PROTECTION

FIELD OF THE INVENTION

This invention relates to manufacture of very large integrated circuits, and specifically to the manufacture of an integrated circuit that incorporates electrostatic discharge protection.

BACKGROUND OF THE INVENTION

Silicon based integrated circuits are susceptible to electrostatic discharge (ESD) damage, particularly in the situation where a user of a device containing an integrated circuit develops a static charge on their body and subsequently comes in contact with the device containing the integrated circuit. The electrostatic charge induced in a human body may produce a voltage on the order of 5,000 volts. As most integrated circuits operate at no higher than five volts, an electrostatic discharge from a human body can be a traumatic experience for the integrated circuit. One way to provide an integrated circuit with ESD protection is to build an integrated circuit on a substrate that is less susceptible to damage from ESD. The integrated circuit may be fabricated on bulk silicon substrates, silicon on insulator (SOI) substrates, or separation by implantation of oxygen (SIMOX) substrates.

The thickness of the top silicon layer of SOI or SIMOX substrates wafers is on the order of 200 nm to 400 nm. If it is desired to fabricate a complimentary metal oxide semiconductor (CMOS) that becomes fully depleted, the conventional film is considerably thicker than is required. A fully depleted CMOS has advantages over a partially depleted CMOS, which advantages are generally referred to as less short channel effect, high speed and "no-kink" effect or a no-parasitic bipolar effect. Additionally, better control is possible over the fabrication process.

In the prior art, however, ESD protection has been minimal in case of fully depleted SIMOX devices. To manufacture a fully depleted SIMOX/SOI CMOS, the film must be thinned to no thicker than 50 nm, for sub-micron CMOS applications. The most suitable ESD protection device on this very thin silicon film is a p-n junction device. However, for diode protection, the junction area is determined by the thickness of the silicon film, and requires a very large area to form the diode.

SUMMARY OF THE INVENTION

The device of the invention is an ESD device to protect a fully-depleted CMOS device from ESD damage. The device is formed on an SOI or SIMOX substrate, over which an oxide pad is grown to a thickness of between 10 and 30 nm. Appropriate ions are implanted into the top silicon film to adjust the doping concentration for ESD device fabrication. The ESD device portion of the wafer is protected with silicon nitride. The top silicon layer of the fully depleted CMOS area is thinned by an oxidation process.

It is an object of the invention to provide an ESD device for protecting a fully depleted SOI CMOS device from ESD damage.

Another object of the invention is to provide such a device in a small surface area.

These and other objects and advantages of the invention will become more fully apparent as the description which follows is read in conjunction with the drawings.

BRIEF DESCRIPTION OF THE DRAWINGS

FIGS. 1–5 depict successive steps in the fabrication of a device according to the invention.

DETAILED DESCRIPTION OF THE PREFERRED EMBODIMENT

A device that is resistant to electrostatic discharge (ESD) damage may be either a diode or a "snap-back" device. ESD devices constructed according to the invention are fabricated onto a thick silicon film, allowing the snap-back device to be constructed and a diode area that may be reduced by two to four times over that of the prior art. The snap-back device may be a floating substrate MOS transistor, a silicon controlled rectifier (SCR), or a PNPN diode. The examples herein use diode and a snap-back transistor as examples of devices constructed according to the invention.

Figure 1:
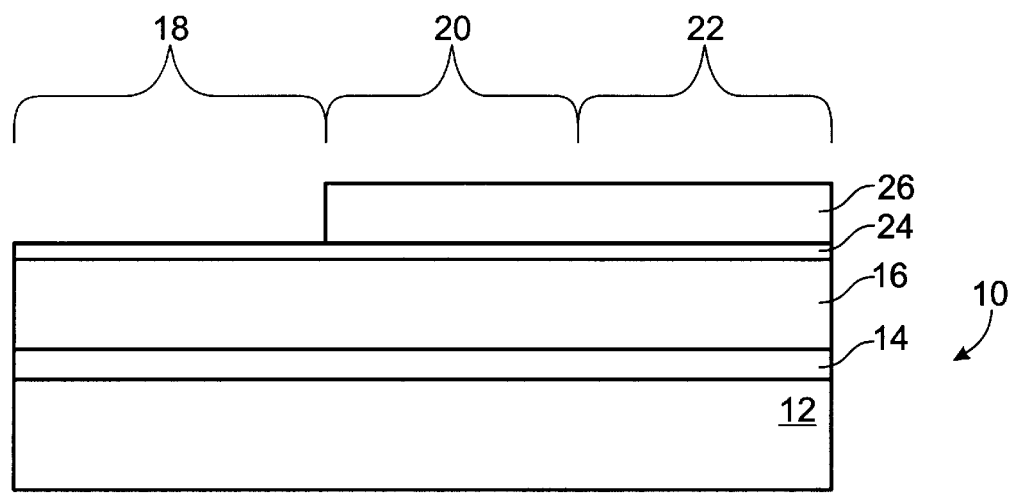

Turning now to the drawings, and referring initially to FIG. 1, a silicon substrate is depicted generally at 10. In the example used herein, substrate 10 is of the separated by implanted oxide (SIMOX) type and includes a silicon layer 12, a buried oxide layer 14 and a top silicon layer 16.

Buried oxide layer 14 has a thickness of between 150 nm and 300 nm. The thickness of top silicon layer 16 typically is between about 200 nm and 400 nm. The fabrication of three separate components that are formed on substrate 10 will be described. A fully depleted MOS transistor area 18 is located at one end of the substrate, an ESD diode area 20 is located in the middle portion thereof, and an ESD MOS transistor (MOST) area 22 is located at the right side of the substrate area. It will be appreciated that the wafer which contains multiple iterations of the device herein is initially prepared from a wafer of pure, single crystal silicon, the remains of which constitute silicon layer 12, and which is treated to form buried oxide layer 14 below top silicon layer 16.

A silicon oxide pad 24 is formed by chemical vapor deposition (CVD) to a thickness of between 10 nm and 30 nm over areas 18, 20 and 22. The portions of oxide pad 24 which overlay area 18 is covered with photoresist, leaving the area of pad 24, which overlays areas 20 and 22 exposed. The exposed portion of pad 24 is then implanted with boron ions, at an energy of between about 10 keV to 30 keV, at a dose of between $5 \cdot 10^{12}$ cm$^{-2}$ and $5 \cdot 10^{13}$ cm$^{-2}$ to adjust the doping density for ESD device fabrication. The photoresist is then removed.

A layer of silicon nitride (SI$_3$N$_4$) 26 is then deposited across the entire width of area 18, 20, 22 by CVD to a thickness of between 100 nm and 200 nm. The nitride layer is covered with photoresist in ESD device areas 20, 22, and the nitride in MOS transistor area 18 is etched. The photoresist is then removed, resulting in the configuration depicted in FIG. 1.

Figure 2:
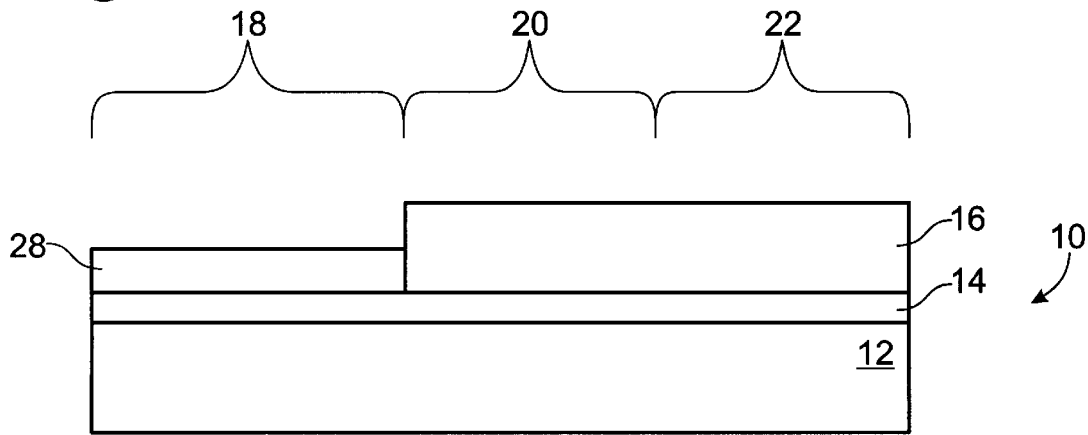

Referring now to FIG. 2, a local oxidation of silicon (LOCOS) process is performed in device area 18, i.e., thermal oxidation is used to thin the top silicon layer to the proper thickness for circuit application, resulting in silicon layer 28, which is no thicker than about 50 nm. The oxide layer and the silicon nitride layer are then removed by etching, resulting in the configuration depicted in FIG. 2.

The active areas, including the ESD area and the fully depleted CMOS transistor area, are covered with photoresist. The silicon on the non-active, field areas, is reactive ion etched (RIE) to provide device isolation. The photoresist is removed from the structure, resulting in the configuration shown in FIG. 3. Alternately, a LOCOS, MESA or STI process may be used for device isolation. Top silicon layer 28, in the fully depleted transistor area 18, is very thin, while top silicon layer 16 in active ESD device areas 20 and 22 is approximately the same thickness as that of the original SIMOX wafer. The relatively thick top silicon film is required for ESD MOS transistor 18 in order to provide the snap-back action, and also to increase the current handling capability of ESD diode 20.

Referring still to FIG. 3, where a single N+ polysilicon gate is used, a blanket $BF_2$ ion implantation, followed by a second $BF_2$ ion implantation, to the n⁻channel transistor active area is required to adjust the threshold voltage. The $BF_2$ ion energy is between about 10 keV and 40 keV. The blanket $BF_2$ implantation ion dose is between $1.0 \cdot 10^{12}$ cm$^{-2}$ and $6.0 \cdot 10^{12}$ cm$^{-2}$. Photoresist is used to mask the p⁻channel transistor area. The second $BF_2$ implantation is performed at an energy of between about 10 keV and 40 keV, at a dose of between about $1.0 \cdot 10^{12}$ cm$^{-2}$ and $6.0 \cdot 10^{12}$ cm$^{-2}$ to adjust the threshold voltage of the n⁻channel transistor. For N+/P+ dual gate structures, the gate electrode of the p⁻channel transistor is P+ doped polysilicon. Phosphorus (P) or arsenic (As) should be used for threshold voltage adjustment. The energy for P and As ion implantation is between about 5 keV and 30 keV, and 10 keV and 50 keV, respectively. The ion dose is between about $1.0 \cdot 10^{12}$ cm$^{-2}$ and $6.0 \cdot 10^{12}$ cm$^{-2}$.

Moving to FIG. 4, a gate oxide layer 30 is grown on all active areas. Polysilicon layers 32, 34 are deposited by CVD process. The polysilicon layers are doped to form n+ layers by an in situ doping process or an ion implantation. In the case of ion implantation, the ion is either that of P or As, with an energy of between about 20 keV and 60 keV, and an ion dose of between about $3.0 \cdot 10^{15}$ cm$^{-2}$ and $10.0 \cdot 10^{15}$ cm$^{-2}$. An alternate process of an n+/p+ dual gate formation may also be used. The device gate areas are then covered with photoresist to allow etching of the polysilicon, leaving the configuration shown in FIG. 4. The photoresist is then removed.

Figure 5:
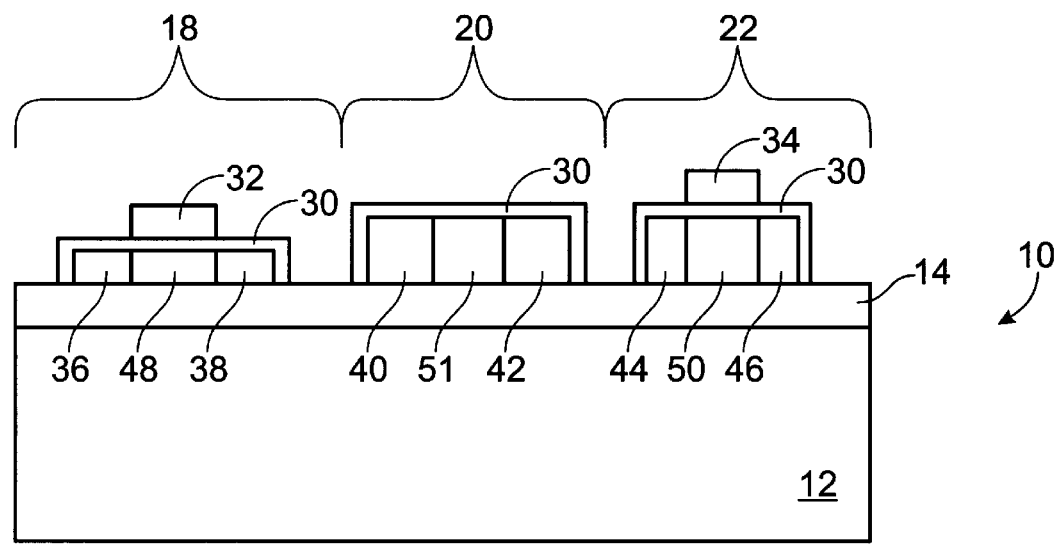

Turning now to FIG. 5, photoresist is again applied to allow for source and drain ion implantation. Ion implantation results in the formation of a number of active regions, including a source 36 and a drain 38 in MOS transistor area 18; an n+ silicon area 40 and a p+ silicon area 42 in ESD diode area 20; and an n+ source 44 and n+ drain 46 in ESD MOST area 22. Gate regions 48 and 50 are located in MOS transistor 18 and ESD MOST 22. A region 51 is located between the n+ and p+ regions of the diode to prevent low breakdown voltage and leakage current of ESD diode 20.

Figure 6:
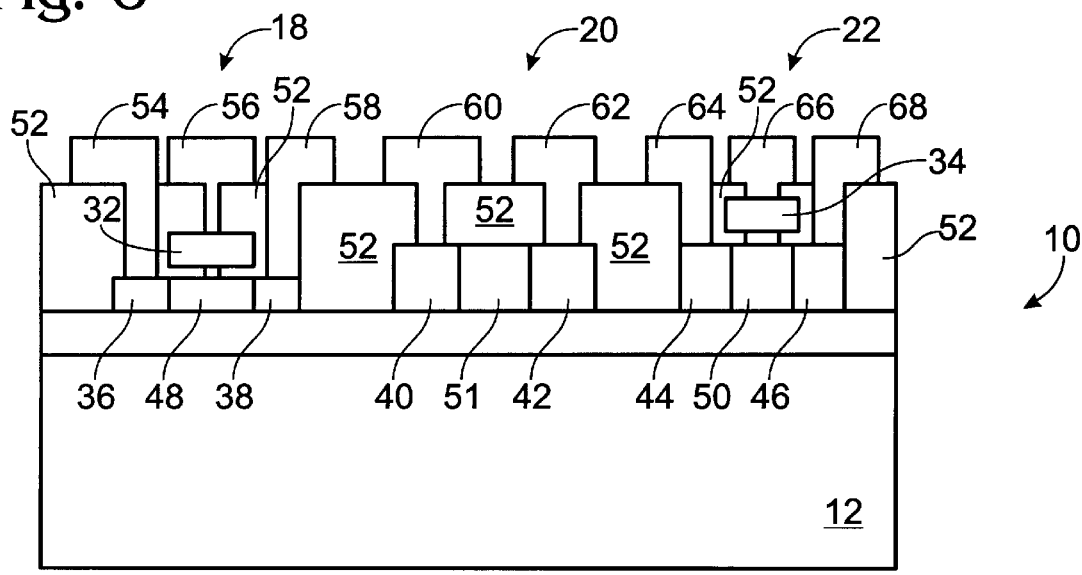
FIG. 6 is a cross-sectional view of an ESD protected device constructed according to the invention.

Referring now to FIG. 6, the entire structure is coated with a layer of oxide 52, preferably by CVD. Oxide 52 is covered with photoresist and etched in preparation for metallization. Electrodes are formed in connection with the appropriate active regions, as shown in FIG. 6, wherein now completed MOS transistor 18 includes a source electrode 54, a gate electrode 56, and a drain electrode 58; ESD diode 20 includes electrodes 60, 62; and ESD MOST 22 includes a source electrode 64, a gate electrode 66, and a drain electrode 68.

Thus, a method of making ESD protected devices with a fully depleted SIMOX CMOS device has been disclosed. It will be appreciated by those of skill in the art that the method may be applied to the formation of other types of ESD protection devices other than those used as exemplars herein. The device of the invention is an ESD device to protect a fully-depleted CMOS device from ESD damage.

The device is formed on an SOI or SIMOX substrate. The ESD device portion of the wafer is protected with silicon nitride. The top silicon of the fully depleted CMOS area is thinned by an oxidation process.

Although a preferred embodiment of the invention, and variations thereof have been disclosed, it should be appreciated that further variations and modifications may be made thereto without departing from the scope of the invention as defined in the appended claims.

I claim:

1. A method of fabricating an electrostatic-discharge device for protection of fully depleted SOI CMOS devices, comprising:

forming a device area on a SIMOX substrate having a top silicon film and an insulating layer therein;

growing an oxide pad on the SIMOX substrate to a thickness of between about 10 nm to 30 nm;

implanting boron ions, at an energy level of between about 10 keV to 30 keV at a dose of between about $5.0 \cdot 10^{12}$ cm$^{-2}$ and $5.0 \cdot 10^{13}$ cm$^{-2}$, to adjust the film doping concentration for ESD device fabrication;

depositing a nitride layer on the oxide layer to a thickness of between about 100 nm to 200 nm;

etching the nitride layer;

oxidizing the top silicon film of the fully depleted CMOS device area to thin the top silicon film;

etching the silicon to form silicon islands; and implanting $BF_2$ ions, at an energy level of between about 10 keV to 40 keV at a dose of between about $1.0 \cdot 10^{12}$ cm$^{-2}$ and $6.0 \cdot 10^{12}$ cm$^{-2}$, to adjust the threshold voltage of the n⁻ channel and p⁻ channel MOS transistors.

2. The method of claim 1 which includes forming an ESD device onto the top silicon film of the wafer.

3. The method of claim 2 wherein said forming includes forming a device taken from the group of devices consisting of pn junctions, MOS transistors, SCRs, and PNPN Shockley diodes.

4. The method of claim 1 which includes metallizing the structure to form contacts for the action regions.

5. The method of claim 1 which includes isolating the device area from other device areas.

6. The method of claim 5 wherein said isolating is performed by a technique taken from the group of techniques consisting of LOCOS, MESA and STI.

7. The method of claim 1 wherein said forming a device area on a SIMOX substrate includes forming a device area on a SIMOX substrate having a top silicon layer with a thickness of at least 200 nm.

8. A method of fabricating an electrostatic-discharge device for protection of fully depleted SOI CMOS devices, comprising:

forming a device area on a SIMOX substrate having a top silicon film having a thickness of between about 200 nm and 400 nm, and an insulating layer therein;

growing an oxide pad on the SIMOX substrate to a thickness of between about 10 nm to 30 nm;

implanting boron ions, at an energy level of between about 10 keV to 30 keV at a dose of between about $5.0 \cdot 10^{12}$ cm$^{-2}$ and $5.0 \cdot 10^{13}$ cm$^{-2}$, to adjust the film doping concentration for ESD device fabrication;

depositing a nitride layer on the oxide layer to a thickness of between about 100 nm to 200 nm;

etching the nitride layer;

oxidizing the top silicon film of the fully depleted CMOS device area to thin the top silicon film;

etching the silicon to form silicon islands; and implanting $BF_2$ ions, at an energy level of between about 10 keV to 40 keV at a dose of between about $1.0 \cdot 10^{12}$ cm$^{-2}$ and $6.0 \cdot 10^{12}$ cm$^{-2}$, to adjust the threshold voltage of the n⁻ channel and p⁻ channel MOS transistors.

9. The method of claim 8 which includes metallizing the structure to form contacts for the action regions.

10. The method of claim 8 which includes forming an ESD device onto the top silicon film of the wafer.

11. The method of claim 10 wherein said forming includes forming a device taken from the group of devices consisting of pn junctions, MOS transistors, SCRs, and PNPN Shockley diodes.

12. The method of claim 8 which includes isolating the device area from other device areas.

13. The method of claim 12 wherein said isolating is performed by a technique taken from the group of techniques consisting of LOCOS, MESA and STI.

* * * * *